United States Patent
Ren et al.

(10) Patent No.: US 9,535,120 B2
(45) Date of Patent: Jan. 3, 2017

(54) INTEGRATED CIRCUIT AND METHOD FOR ESTABLISHING SCAN TEST ARCHITECTURE IN INTEGRATED CIRCUIT

(71) Applicant: MediaTek Singapore Pte. Ltd., Singapore (SG)

(72) Inventors: Jianguo Ren, Beijing (CN); Chong Dai, Beijing (CN); Fengguo Gao, Hefei (CN); Shang-Bin Huang, New Taipei (TW); Wen-hao Hsueh, New Taipei (TW)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 3 days.

(21) Appl. No.: 14/641,572

(22) Filed: Mar. 9, 2015

(65) Prior Publication Data
US 2015/0276871 A1    Oct. 1, 2015

(30) Foreign Application Priority Data
Mar. 31, 2014 (CN) .......................... 2014 1 0126238

(51) Int. Cl.
| | | |
|---|---|---|
| G01R 31/317 | (2006.01) | |
| G01R 31/3177 | (2006.01) | |
| G01R 31/3185 | (2006.01) | |
| G06F 17/10 | (2006.01) | |
| G06F 17/50 | (2006.01) | |

(52) U.S. Cl.
CPC ..... *G01R 31/3177* (2013.01); *G01R 31/31704* (2013.01); *G01R 31/318547* (2013.01); *G01R 31/318552* (2013.01); *G01R 31/318594* (2013.01); *G06F 17/505* (2013.01); *G01R 31/318544* (2013.01); *G01R 31/318583* (2013.01); *G06F 2217/14* (2013.01)

(58) Field of Classification Search
CPC ............... G01R 31/318547; G01R 31/318594; G01R 31/31704; G01R 31/318544; G01R 31/318583; G06F 17/505; G06F 2217/14
USPC .......................................... 714/726; 716/710
See application file for complete search history.

(56) References Cited

U.S. PATENT DOCUMENTS

| | | | | |
|---|---|---|---|---|
| 6,957,403 B2 * | 10/2005 | Wang | ............... | G01R 31/31704 703/16 |
| 7,093,213 B2 * | 8/2006 | Cohn | ................... | G06F 17/505 714/726 |

(Continued)

*Primary Examiner* — James C Kerveros
(74) *Attorney, Agent, or Firm* — McClure, Qualey & Rodack, LLP

(57) ABSTRACT

An integrated circuit and method for establishing scan test architecture in the integrated circuit is provided. The integrated circuit includes a plurality of circuit modules. Each circuit module includes a clock control unit, a first pipeline unit, a serialized compressed scan circuit and a second pipeline unit. The clock control unit generates a scan clock according to a test clock. The first pipeline unit converts a test input signal into first data according to the scan clock. The serialized compressed scan circuit generates second data according to the first data and the test clock. The second pipeline unit converts the second data into a test output signal according to the scan clock. The scan clock of each of the circuit modules is independent from the scan clocks of the other circuit modules, thereby reducing the difficulty and cost of timing analysis and adjustment.

16 Claims, 6 Drawing Sheets

(56) References Cited

U.S. PATENT DOCUMENTS

| | | | | |
|---|---|---|---|---|
| 7,774,735 B1* | 8/2010 | Sood | ............... | G06F 17/5045 |
| | | | | 716/103 |
| 7,823,034 B2* | 10/2010 | Wohl | ............ | G01R 31/318547 |
| | | | | 714/726 |
| 7,937,677 B2* | 5/2011 | Chien | ............... | G06F 17/505 |
| | | | | 716/103 |
| 8,001,505 B2* | 8/2011 | Bist | ............... | G06F 17/5022 |
| | | | | 716/100 |
| 8,099,702 B2* | 1/2012 | Hou | ............... | G06F 17/5072 |
| | | | | 716/126 |
| 8,219,947 B2* | 7/2012 | Bist | ............... | G06F 17/5022 |
| | | | | 703/14 |
| 8,584,073 B2* | 11/2013 | Kapur | ............ | G01B 31/318583 |
| | | | | 714/732 |
| 8,650,524 B1* | 2/2014 | Chakravadhanula | ............ | |
| | | | | G06F 17/505 |
| | | | | 716/106 |
| 8,890,563 B2* | 11/2014 | Lin | ............ | G01B 31/318575 |
| | | | | 324/73.1 |
| 8,904,256 B1* | 12/2014 | Chakravadhanula | ............ | |
| | | | | G01B 31/318547 |
| | | | | 714/729 |

* cited by examiner

INTEGRATED CIRCUIT AND METHOD FOR ESTABLISHING SCAN TEST ARCHITECTURE IN INTEGRATED CIRCUIT

CROSS REFERENCE TO RELATED APPLICATIONS

This Application claims priority of China Patent Application No. 201410126238.9, filed on Mar. 31, 2014, the entirety of which is incorporated by reference herein.

BACKGROUND OF THE INVENTION

Field of the Invention

The invention relates to an integrated circuit (IC), and more particularly to an integrated circuit having scan test architecture and a method for establishing the scan test architecture in the integrated circuit.

Description of the Related Art

With the growing complexity of circuit designs, more transistors are being implemented on a single chip. With the growing complexity of current chip design, the test design of integrated circuit will become increasingly important. Therefore, a good test design method is needed in the chip design flow, to diagnose defects in the manufacturing process of the complex system-on-chip (SOC) integrated circuit early.

For complex integrated circuits, when the used logic units are increased, the time required for performing a scan test is increased, increasing the cost of testing the integrated circuit. Therefore, a serialized compressed scan architecture (SCSA) is used to perform a scan test in the design for testability (DFT) of the integrated circuits, wherein the SCSA can use the limited test input pins/pads and the output pins/pads to substantially increase the number of scan chains. When the number of scan chains is increased, the length of the scan chains is decreased, thereby decreasing testing time. Furthermore, by using the SCSA to compress the test data, the test data quantity can be decreased. Therefore, the test time is also decreased, thereby decreasing the test cost of the integrated circuits.

BRIEF SUMMARY OF THE INVENTION

An integrated circuit and a method for establishing scan test architecture in an integrated circuit are provided. An embodiment of an integrated circuit is provided. The integrated circuit comprises a plurality of circuit modules. Each of the circuit modules comprises: a first clock control unit, generating a first scan clock according to a test clock; a first pipeline unit, converting a test input signal into first data according to the first scan clock; a serialized compressed scan circuit, generating second data according to the first data and the test clock; and a second pipeline unit, converting the second data into a test output signal according to the first scan clock. The first scan clock of each of the circuit modules is independent from the first scan clocks of the other circuit modules.

Furthermore, an embodiment of a method for establishing scan test architecture in an integrated circuit is provided, wherein the integrated circuit comprises a plurality of circuit modules. A scan test architecture establishing process is performed on one of the circuit modules. A synthesis process of the circuit module is performed to obtain a first netlist of the circuit module, wherein the first netlist comprises a circuit under test and a test circuit of the circuit module, wherein the circuit under test comprises a plurality of scan chain circuits, and the test circuit comprises a first pipeline unit, a second pipeline unit, a third pipeline unit coupled between the scan chain circuits and the first pipeline unit, and a fourth pipeline unit coupled between the scan chain circuits and the second pipeline unit. An automatic place and route (APR) process is performed on the first netlist to generate a second netlist, wherein the second netlist does not comprise the first pipeline unit and the second pipeline unit. A test netlist is generated according to the second netlist and a clock controller. A design rules check (DRC) process is performed on the test netlist.

Moreover, another embodiment of a method for establishing scan test architecture in an integrated circuit is provided, wherein the integrated circuit comprises a plurality of circuit modules. A synthesis process of each of the circuit modules is performed, to respectively obtain a first netlist corresponding to the circuit module, wherein the first netlist comprises a circuit under test and a test circuit corresponding to the circuit module, wherein the circuit under test comprises a plurality of scan chain circuits, and the test circuit comprises a first pipeline unit, a second pipeline unit, a third pipeline unit coupled between the scan chain circuits and the first pipeline unit, and a fourth pipeline unit coupled between the scan chain circuits and the second pipeline unit. An automatic place and route (APR) process of each of the first netlists is performed, to respectively generate a second netlist corresponding to the circuit module, wherein the second netlist does not comprise the first pipeline unit and the second pipeline unit. A synthesis process of all of the second netlists is performed, to obtain a third netlist. A top test netlist is generated according to the third netlist, the first pipeline unit and the second pipeline unit of each of the circuit modules, and a clock controller of each of the circuit modules. A design rules check (DRC) process of the top test netlist is performed.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
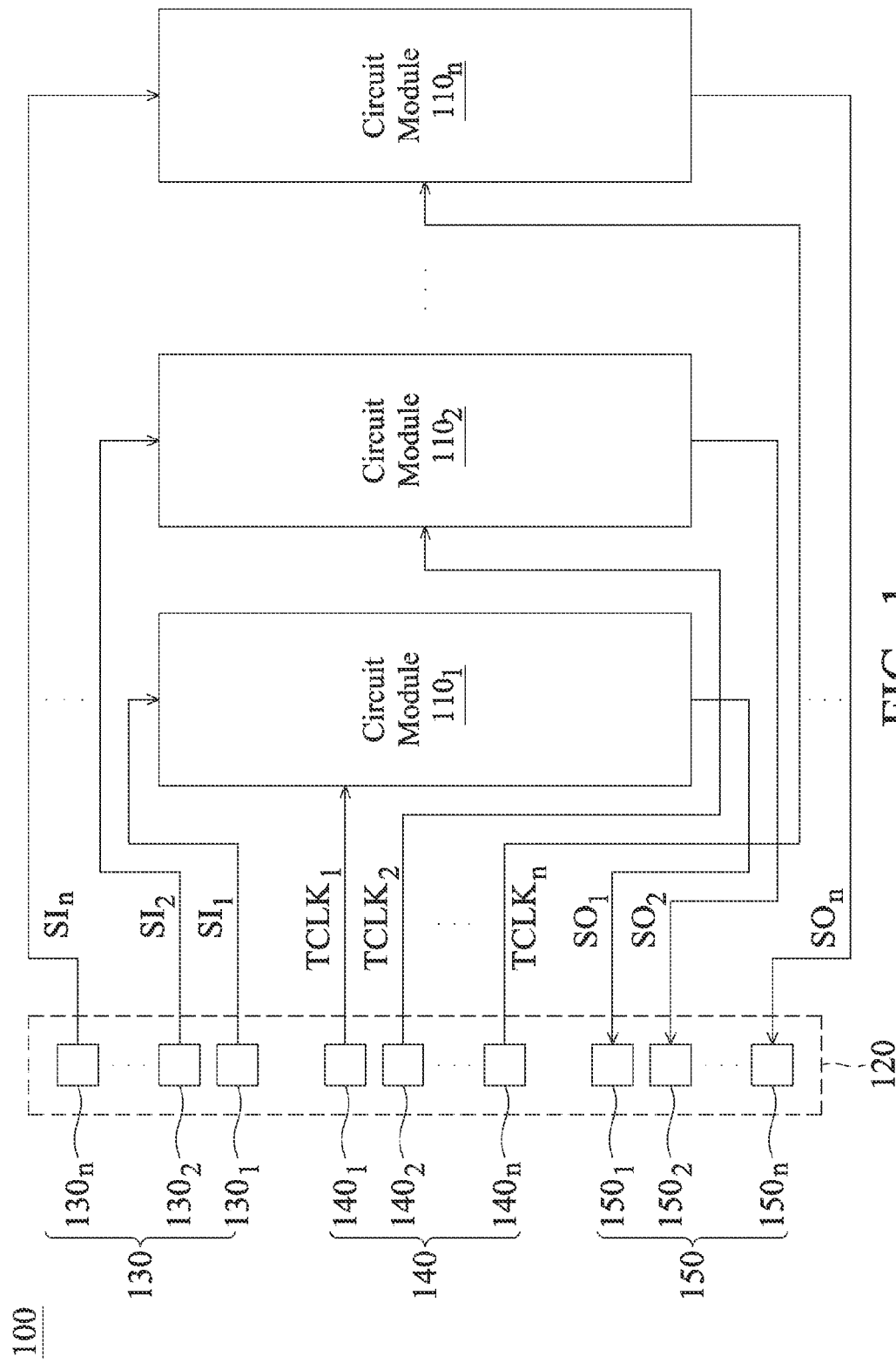
FIG. 1 shows an integrated circuit (IC) according to an embodiment of the invention.

FIG. 1 shows an integrated circuit (IC) 100 according to an embodiment of the invention. The IC 100 comprises a plurality of circuit modules $110_1$-$110_n$ and a test access port (TAP) 120, wherein the circuit modules $110_1$-$110_n$ are digital logic circuits. When the IC 100 is operating in a scan test mode, a plurality of scan cells within the circuit modules $110_1$-$110_n$ will be connected in series to form various scan chains, and a test apparatus (not shown) will input a test clock TCLK and a test input SI into the scan chains via the TAP 120. Next, the test apparatus obtains a test output SO from the scan chains via the TAP 120, and can debug the circuit modules $110_1$-$110_n$ according to the test output SO. In the embodiment, the TAP 120 comprises a first group of pads 130, a second group of pads 140 and a third group of pads 150. The first group of pads 130 comprises a plurality of pads $130_1$-$130_n$, wherein the pads $130_1$-$130_n$ are capable of providing the test inputs $SI_1$-$SI_n$ from the test apparatus to the circuit modules $110_1$-$110_n$, respectively. The second group of pads 140 comprises a plurality of pads $140_1$-$140_n$, wherein the pads $140_1$-$140_n$ are capable of providing the test clocks $TCLK_1$-$TCLK_n$ from the test apparatus to the circuit modules $110_1$-$110_n$, respectively. The third group of pads 150 comprises a plurality of pads $150_1$-$150_n$, wherein the pads $150_1$-$150_n$ are capable of providing the test outputs $SO_1$-$SO_n$ from circuit modules $110_1$-$110_n$ to the test apparatus, respectively. Thus, according to the test outputs $SO_1$-$SO_n$, the test apparatus can complete the test operation, such as a Chip Probing (CP) or Final Test (FT) of the IC 100, and determine whether the IC 100 is normal. It should be noted that the test clocks $TCLK_1$-$TCLK_n$ of the circuit module $110_1$-$110_n$ are directly provided by the test apparatus. When the scan test is performed in the IC 100, each circuit module individually performs the scan test. Therefore, timing considerations of the test clocks of each circuit module are only related to the actual circuit architecture within the circuit module, and are independent of the test clocks of the other circuit modules. For example, when the IC 100 performs the scan test, the test clocks $TCLK_1$-$TCLK_n$ are independent of each other.

Figure 2:
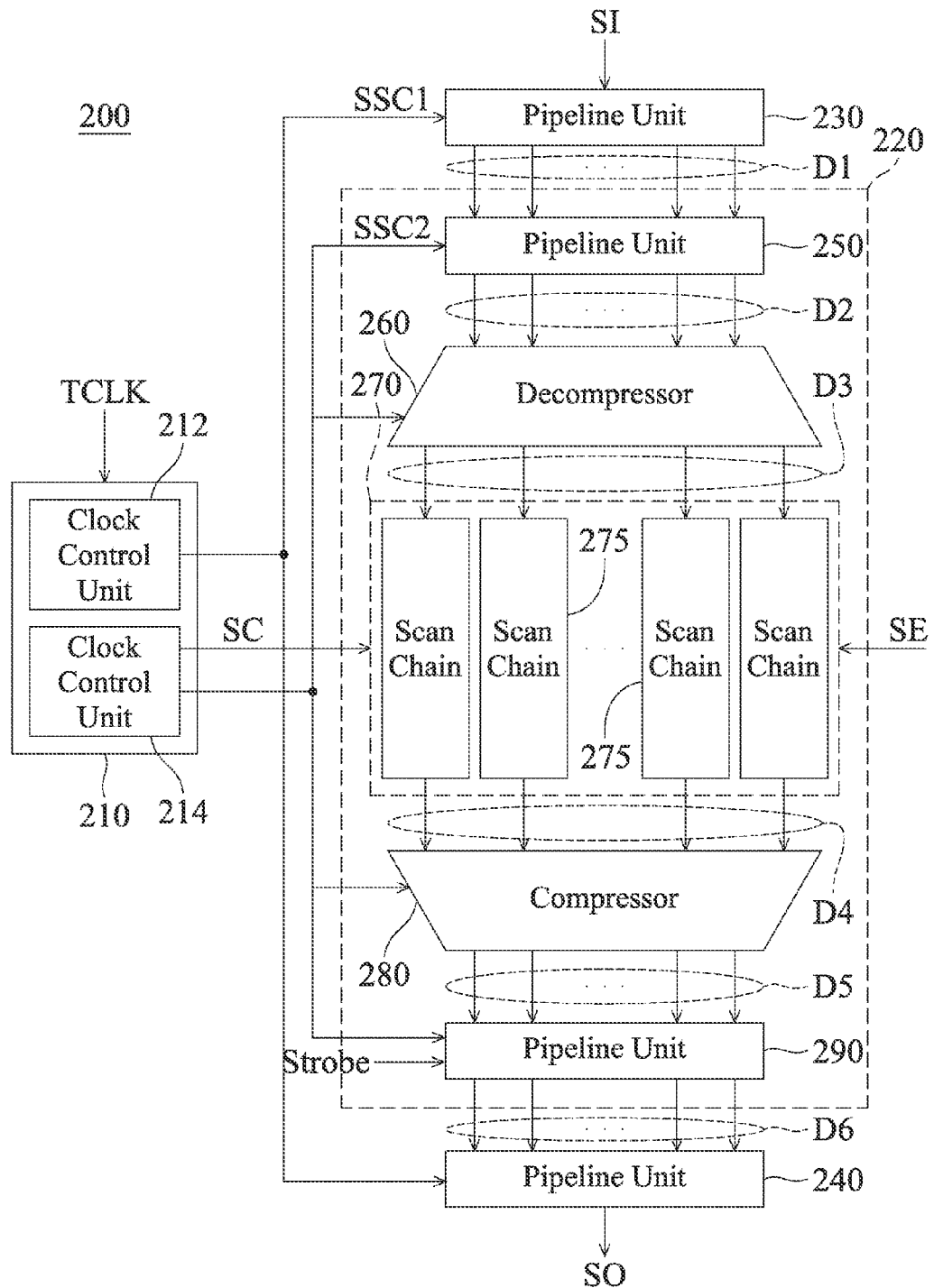
FIG. 2 shows a circuit module of an integrated circuit according to an embodiment of the invention, such as the circuit modules of FIG. 1.

FIG. 2 shows a circuit module 200 of an integrated circuit according to an embodiment of the invention, such as the circuit modules 1101-110n of FIG. 1, wherein the circuit module 200 conforms to a serialized scan compression interface standard. The circuit module 200 comprises a serialized clock controller 210, a serialized compressed scan circuit 220, a pipeline unit 230 and a pipeline unit 240. The serialized clock controller 210 comprises the clock control units 212 and 214. The clock control unit 212 can receive a test clock TCLK from a test apparatus via a test access port (e.g. the second group of pads 140 of FIG. 1), and provide a serialized scan clock signal SSC1 to the pipeline unit 230 and the pipeline unit 240. Furthermore, the clock control unit 214 can provide a serialized scan clock signal SSC2 and a scan clock signal SC to the serialized compressed scan circuit 220 according to the test clock TCLK. The serialized compressed scan circuit 220 comprises a pipeline unit 250, a decompressor 260, a circuit under test with parallel scan chains 275, a compressor 280 and a pipeline unit 290. In the embodiment, the pipeline unit 230 and the pipeline unit 240 are the first stage pipeline units of the circuit module 200, wherein the first stage pipeline units, the clock control unit 212 and the serialized compressed scan circuit 220 are implemented in the same hierarchical layer of the circuit module 200. The pipeline unit 250 and the pipeline unit 290 are the second stage pipeline units of the circuit module 200, wherein the second stage pipeline units, the decompressor 260, the circuit under test 270 and the compressor 280 are implemented in the same hierarchical layer of the circuit module 200. In FIG. 2, the pipeline unit 250 comprises the deserializer registers (not shown), that form a deserializer, wherein the deserializer is a serial-to-parallel converter. Moreover, the pipeline unit 290 comprises the serializer registers (not shown), that form a serializer, wherein the serializer is a parallel-to-serial converter. In the embodiment, using two stages of pipeline units to implement the deserializer and the serializer can optimize performances over the use of a clock tree synthesis in a circuit synthesis process, and then clock issues, such as a clock skew, a clock latency or a clock transition can be decreased or avoided in the test.

In FIG. 2, in response to the serialized scan clock signal SSC1, the pipeline unit 230 receives the test input SI from the test apparatus via a test access port of the integrated circuit (e.g. the first group of pads 130 of FIG. 1), wherein the test input SI may function as a serialized scan data input signal. Furthermore, according to the serialized scan clock signal SSC1, the pipeline unit 230 converts the test input SI into the data D1 having a plurality of bits, and provides the data D1 to the pipeline unit 250. Next, in response to the serialized scan clock signal SSC2, the pipeline unit 250 generates the data D2 according to the data D1, and provides the data D2 to the decompressor 260. The decompressor 260 decompresses the data D2 to generate a plurality of data D3 without compression. The circuit under test 270 comprises a plurality of parallel scan chains (PSCs) 275. When a scan test process is performed on the integrated circuit, each parallel scan chain 275 can receive the data D3 according to the scan clock signal SC and a shifter enable signal SE, and perform the scan test to generate the data D4. The operation of the parallel scan chain 275 is a common digital integrated circuit scan test method. For example, in response to each scan clock signal SC, each scan chain 275 receives a bit of the data D3, i.e. the scan chain scans and shifts one bit. The compressor 280 compresses the plurality of bits of the data D4 from the circuit under test 270 to generate the data D5 having a plurality of bits. In response to the serialized scan clock signal SSC2 and a strobe signal Strobe, the pipeline unit 290 generates the data D6 according to the data D5, and provides the data D6 to the pipeline unit 240. Next, the pipeline unit 240 converts the data D6 having the plurality of bits into the test output SO according to the serialized scan clock signal SSC1, wherein the test output SO is a serialized scan data output signal. Thus, the test apparatus can determine whether the circuit under test 270 of the circuit module 200 is normal according to the test output SO via a test access port of the integrated circuit (e.g. the third group of pads 150 of FIG. 1).

Figure 3A:
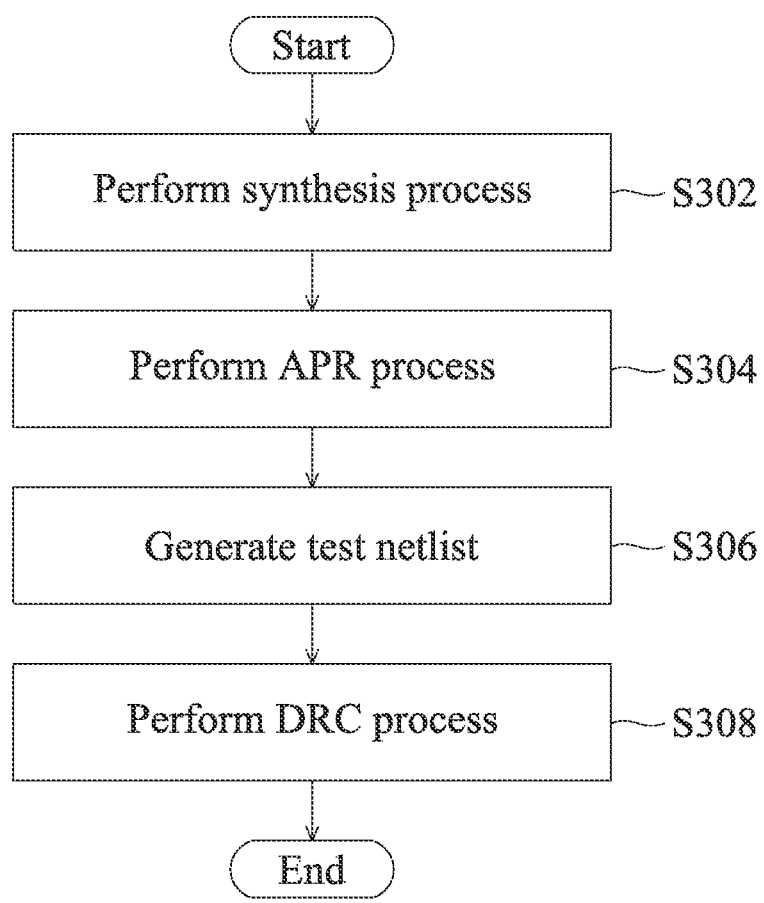
FIG. 3A shows a method for establishing scan test architecture in an integrated circuit according to an embodiment of the invention.
Figure 3B:
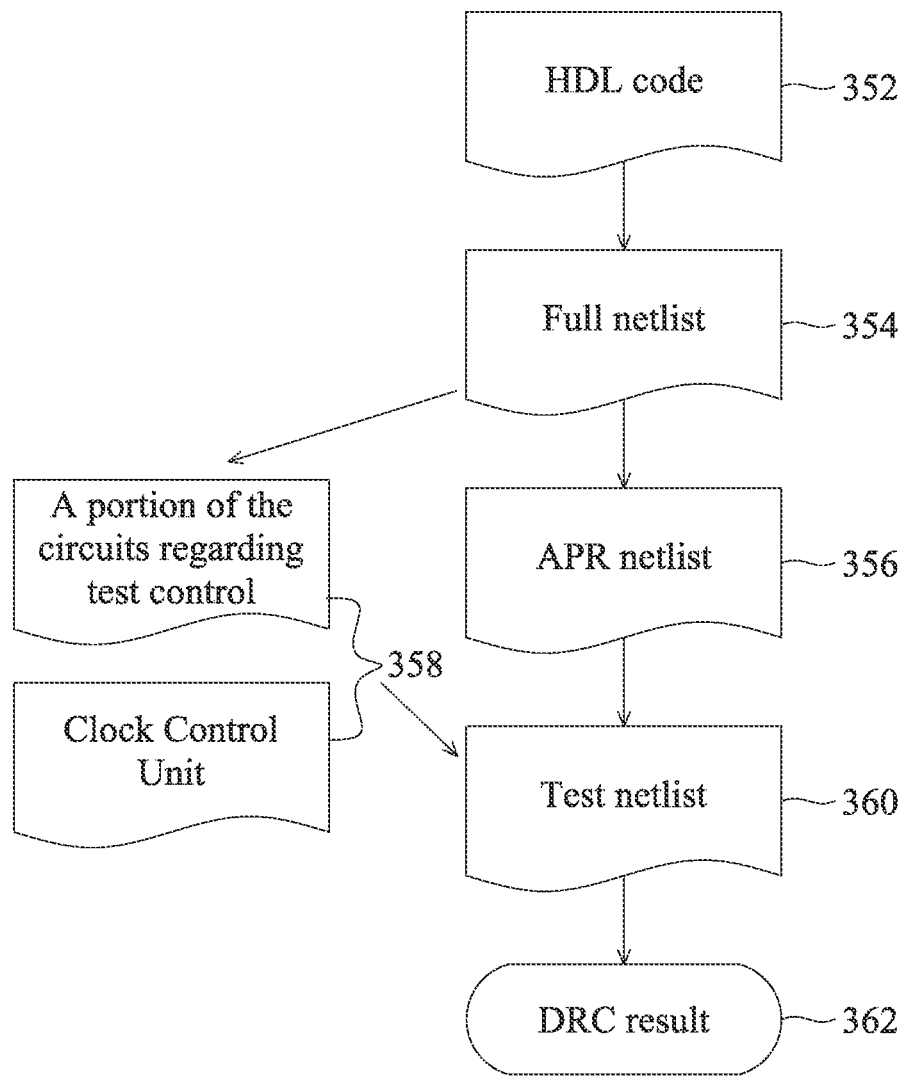
FIG. 3B shows a schematic illustrating implementation of the method of FIG. 3A.

FIG. 3A shows a method for establishing scan test architecture in an integrated circuit according to an embodiment of the invention, and FIG. 3B shows a schematic illustrating implementation of the method of FIG. 3A, wherein the method of FIG. 3A may be performed by a processor capable of performing an electronic design automation (EDA) tool. Referring to FIG. 2, FIG. 3A and FIG. 3B together, first, in step S302, the processor will perform a synthesis process on a hardware description language (HDL) code 352 of whole circuits of the circuit module 200, to generate a full netlist 354 of the circuit module 200. Next, in step S304, the processor removes a portion of the circuits 358 regarding test control from the full netlist 354, and then performs an automatic place and route (APR) process on the full netlist 354 to generate an APR netlist 356. In the embodiment, the portion of the circuits 358 regarding test control comprises the first stage pipeline units of the circuit module 200 (i.e. the pipeline units 230 and 240). Next, in step S306, the processor generates a test netlist 360 according to the APR netlist 356 and the circuits 358 regarding test control, wherein the circuits 358 regarding test control comprises the first stage pipeline units of the circuit module 200 (i.e. the pipeline units 230 and 240) and the clock control unit 212. In the test netlist 360, the clock control unit 212, the pipeline units 230 and 240 and the APR netlist 356 are implemented in a top layer of the circuit module 200. Next, in step S308, the processor performs a design rules check (DRC) process on the test netlist 360, to verify whether the test netlist 360 meets the layout standards in manufacturing processes, so as to obtain a DRC result 362. According to the method of FIG. 3A, the processor can generate the corresponding test netlists for each of the circuit modules $110_1$-$110_n$ of FIG. 1, and further perform the DRC process on the test netlist of each of the circuit modules $110_1$-$110_n$.

Figure 4A:
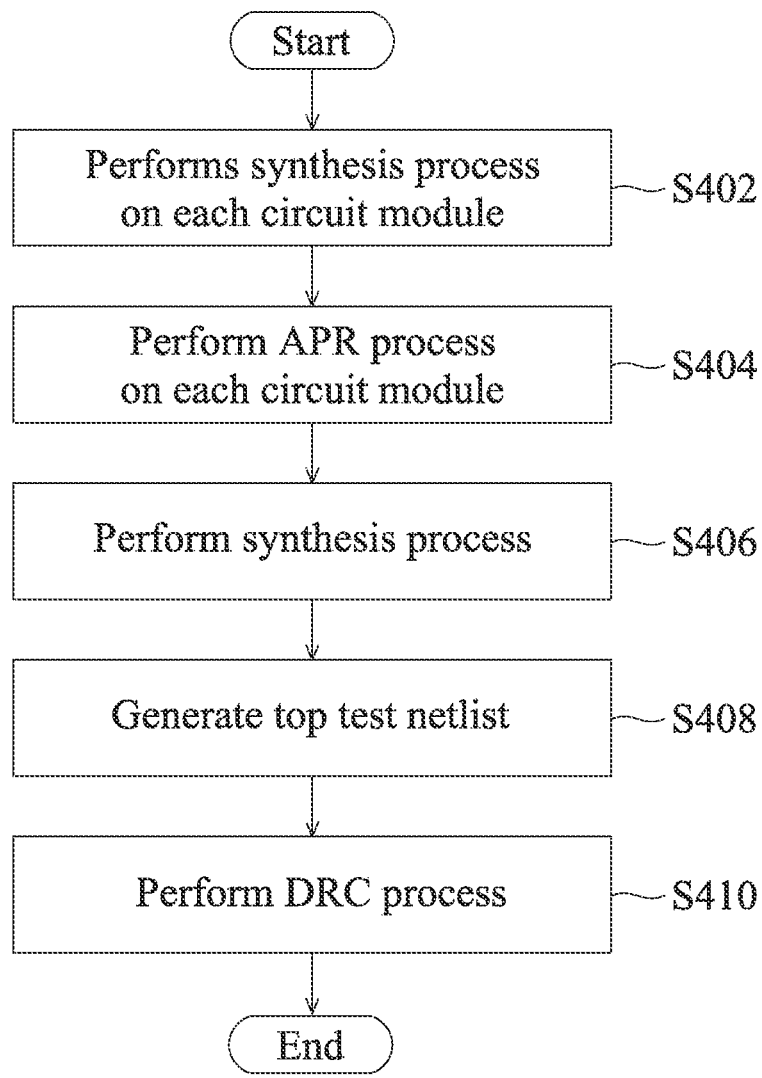
FIG. 4A shows a method for establishing scan test architecture in an integrated circuit according to another embodiment of the invention.
Figure 4B:
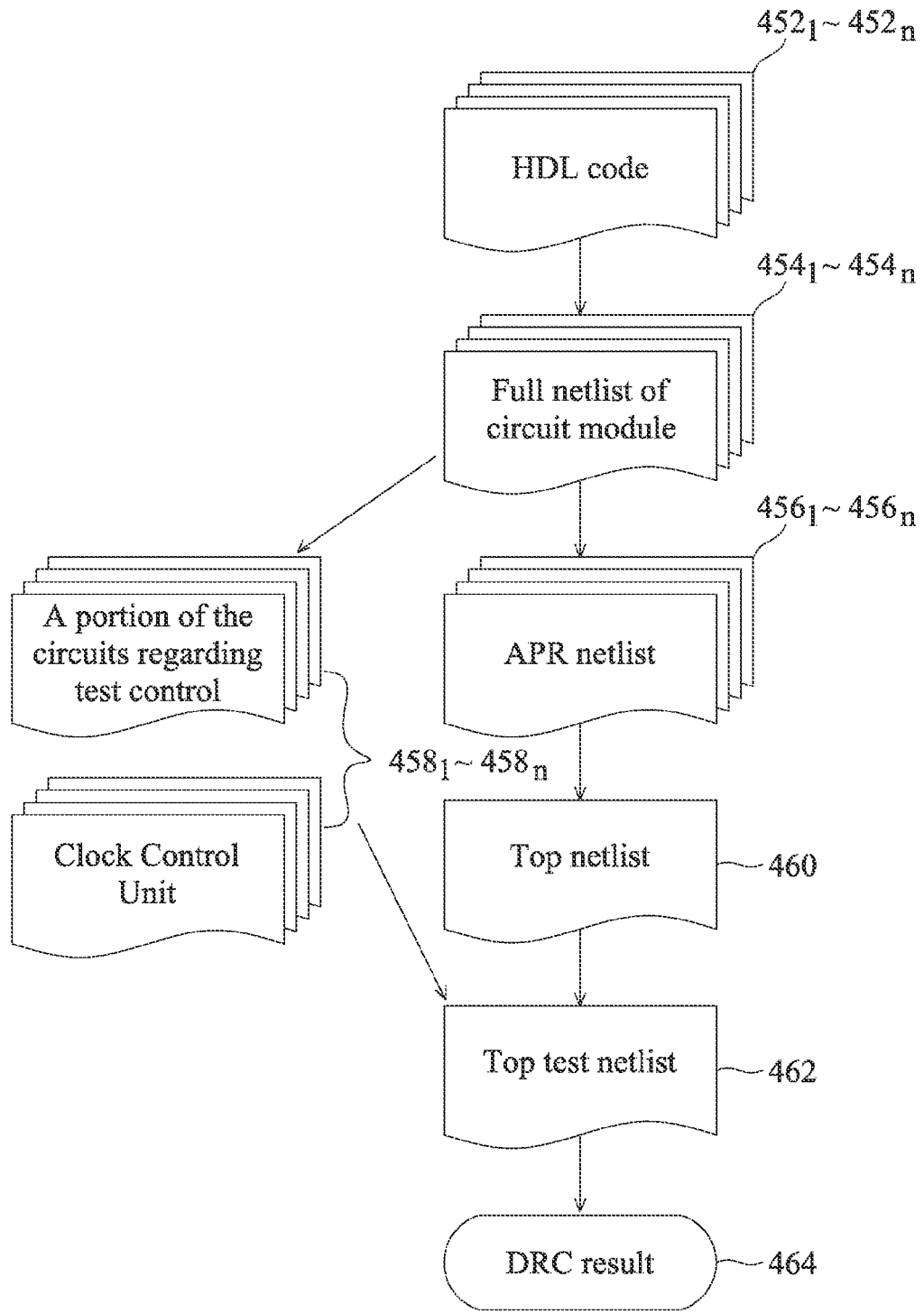
FIG. 4B shows a schematic illustrating an implementation according to the method of FIG. 4A.

FIG. 4A shows a method for establishing scan test architecture in an integrated circuit according to another embodiment of the invention, and FIG. 4B shows a schematic illustrating an implementation according to the method of FIG. 4A, wherein the method of FIG. 4A may be performed by a processor capable of performing EDA tool, and the integrated circuit comprises a plurality of circuit modules. Referring to FIG. 4A and FIG. 4B together, first, in step S402, the processor performs a synthesis process on each of the HDL codes $452_1$-$452_n$ of the circuit modules of the integrated circuit, to respectively generate the corresponding full netlists $454_1$-$454_n$. For example, the processor performs the synthesis process on the HDL code $452_1$ of a first circuit module, to generate the full netlist $454_1$ of the first circuit module. Next, in step S404, the processor removes a portion of each of the circuits $458_1$-$458_n$ regarding test control from the corresponding full netlists $454_1$-$454_n$ for each circuit module, and then performs the APR processes on the full netlists $454_1$-$454_n$ to respectively generate the APR netlists $456_1$-$456_n$. For example, the processor removes a portion of the circuits $458_1$ regarding test control from the full netlist $454_1$ of the first circuit module, and then performs the APR process on the full netlist $454_1$ to generate the APR netlist $456_1$ of the first circuit module. As described above, the portion of each of the circuits $458_1$-$458_n$ regarding test control comprises the first stage pipeline units of the corresponding circuit module (e.g. the pipeline units 230 and 240 of FIG. 2). Next, in step S406, the processor performs a synthesis process on the whole APR netlists $456_1$-$456_n$ to obtain a top netlist 460. Next, in step S408, the processor inserts/adds the circuits $458_1$-$458_n$ regarding test control into the top netlist 460, to generate a top test netlist 462. Each of circuits $458_1$-$458_n$ regarding test control comprises the first stage pipeline units of the corresponding circuit module (e.g. the pipeline units 230 and 240 of FIG. 2) and the clock control unit corresponding to the first stage pipeline units (e.g. the clock control unit 212 of FIG. 2). In the top test netlist 462, the circuits $458_1$-$458_n$ regarding test control and the circuit modules are implemented in a top layer of the integrated circuit. Next, in step S410, the processor performs a DRC process on the top test netlist 462, to verify whether the top test netlist 462 meets the layout standards of manufacturing processes, so as to obtain a DRC result 464.

According to the embodiments, each circuit module of the integrated circuit has an individual serialized clock controller, i.e. the scan clock of each circuit module is independent. Thus, a scan shifter frequency of the integrated circuit can be increased. Furthermore, compared with a conventional integrated circuit that only uses one serialized clock controller to provide a plurality of related serialized scan clocks, the processor of the embodiments can easily perform a timing closure process on each circuit module when the APR process is performed, so that the clock tree of each circuit module can be optimized. Next, the processor only needs to synthesize each circuit module having timing closure and the corresponding first stage pipeline unit, without performing the timing closure process on the whole chip. Therefore, hierarchical timing signoff can be completed, thereby reducing the difficulty and cost of timing analysis and adjustment.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for establishing scan test architecture in an integrated circuit, wherein the integrated circuit comprises a plurality of circuit modules, comprising:
   performing a scan test architecture establishing process on one of the circuit modules, wherein the step of performing the scan test architecture establishing process further comprises:
   performing a synthesis process on the circuit module, to obtain a first netlist of the circuit module, wherein the first netlist comprises a circuit under test and a test circuit of the circuit module, wherein the circuit under test comprises a plurality of scan chain circuits, and the test circuit comprises a first pipeline unit, a second pipeline unit, a third pipeline unit coupled between the scan chain circuits and the first pipeline unit, and a fourth pipeline unit coupled between the scan chain circuits and the second pipeline unit;
   performing an automatic place and route (APR) process on the first netlist, to generate a second netlist, wherein the second netlist does not comprise the first pipeline unit and the second pipeline unit;
   generating a test netlist according to the second netlist and a clock controller; and
   performing a design rules check (DRC) process on the test netlist.

2. The method as claimed in claim 1, wherein the step of performing the APR process on the first netlist to generate the second netlist further comprises:
   removing the first pipeline unit and the second pipeline unit from the first netlist of the circuit module, to generate a third netlist; and
   performing the APR process on the third netlist to generate the second netlist.

3. The method as claimed in claim 1, wherein the test circuit further comprises:
   a decompressor coupled between the third pipeline unit and the scan chain circuits; and
   a compressor coupled between the scan chain circuits and the fourth pipeline unit.

4. The method as claimed in claim 1, wherein the third pipeline unit forms a deserializer, and the fourth pipeline unit forms a serializer.

5. The method as claimed in claim 1, further comprising:
performing the scan test architecture establishing process on at least another one of the circuit modules.

6. The method as claimed in claim 1, further comprising:
performing a scan test process on the circuit under test of the circuit module,
wherein the clock controller is coupled between a first pad of the integrated circuit,
wherein during the scan test process, the clock controller generates a first scan clock according to a test clock from the first pad.

7. The method as claimed in claim 6, wherein during the scan test process, the first pipeline unit provides a test input signal from a second pad of the integrated circuit to the third pipeline unit in response to the first scan clock, so as to perform the scan test process on the circuit under test, and the second pipeline unit provides a test result of the scan test process performed on the circuit under test, to a third pad of the integrated circuit in response to the first scan clock.

8. The method as claimed in claim 7, wherein during the scan test process, the clock controller further generates a second scan clock according to the test clock from the first pad, wherein the third pipeline unit provides the test input signal from the first pipeline unit to the scan chain circuits in response to the second scan clock, and the fourth pipeline unit provides the test result from the circuit under test to the second pipeline unit in response to the second scan clock.

9. A method for establishing scan test architecture in an integrated circuit, wherein the integrated circuit comprises a plurality of circuit modules, comprising:
performing a synthesis process on each of the circuit modules, to respectively obtain a first netlist corresponding to the circuit module, wherein the first netlist comprises a circuit under test and a test circuit corresponding to the circuit module, wherein the circuit under test comprises a plurality of scan chain circuits, and the test circuit comprises a first pipeline unit, a second pipeline unit, a third pipeline unit coupled between the scan chain circuits and the first pipeline unit, and a fourth pipeline unit coupled between the scan chain circuits and the second pipeline unit;
performing an automatic place and route (APR) process on each of the first netlists, to respectively generate a second netlist, wherein the second netlist does not comprise the first pipeline unit and the second pipeline unit;
performing a synthesis process on all of the second netlists, to obtain a third netlist;
generating a top test netlist according to the third netlist, the first pipeline unit and the second pipeline unit of each of the circuit modules, and a clock controller of each of the circuit modules; and
performing a design rules check (DRC) process on the top test netlist.

10. The method as claimed in claim 9, wherein the step of performing the APR process on each of the first netlists, to respectively generate the second netlist further comprises:
removing the first pipeline unit and the second pipeline unit from the first netlist of each of the circuit modules, to respectively generate a fourth netlist; and
performing the APR process on each of the third netlist, to generate the second netlist.

11. The method as claimed in claim 9, wherein the test circuit further comprises:
a decompressor coupled between the third pipeline unit and the scan chain circuits; and
a compressor coupled between the scan chain circuits and the fourth pipeline unit.

12. The method as claimed in claim 9, wherein the step of generating the top test netlist according to the third netlist, the first pipeline unit and the second pipeline unit of each of the circuit modules, and the clock controller of each of the circuit modules further comprises:
adding the first pipeline unit, the second pipeline unit and the clock controller of each of the circuit modules into the corresponding third netlist, to generate the top test netlist.

13. The method as claimed in claim 9, wherein the third pipeline unit forms a deserializer, and the fourth pipeline unit forms a serializer.

14. The method as claimed in claim 9, further comprising:
performing a scan test process on the circuit under test of each of the circuit modules,
wherein each of the clock controllers is coupled to one of a plurality of first pads of the integrated circuit,
wherein during the scan test process, each of the clock controllers generates a first scan clock according to a test clock from the corresponding first pad, and the first scan clock of each of the clock controllers is independent from the first scan clocks of other of the clock controllers.

15. The method as claimed in claim 14, wherein during the scan test process, each of the first pipeline units provides a test input signal from a second pad of the integrated circuit to the corresponding third pipeline unit in response to the corresponding first scan clock, so as to perform the scan test process on the corresponding circuit under test, and each of the second pipeline units provides a test result of the scan test process performed on the corresponding circuit under test to a third pad of the integrated circuit in response to the corresponding first scan clock.

16. The method as claimed in claim 15, wherein during the scan test process, each of the clock controllers further generates a second scan clock according to the test clock from the corresponding first pad, wherein each of the third pipeline units provides the test input signal from the corresponding first pipeline unit to the scan chain circuits in response to the corresponding second scan clock, and each of the fourth pipeline units provides the test result from the corresponding circuit under test to the corresponding second pipeline unit in response to the corresponding second scan clock.

* * * * *